United States Patent [19]
Migliavacca

[11] Patent Number: 6,160,424
[45] Date of Patent: Dec. 12, 2000

[54] LOW SUPPLY VOLTAGE COMPARATOR IN BICMOS TECHNOLOGY

[75] Inventor: Paolo Migliavacca, Grenoble, France

[73] Assignee: STMicroelectronics S.A., Gentilly, France

[21] Appl. No.: 09/376,106

[22] Filed: Aug. 17, 1999

[30] Foreign Application Priority Data

Aug. 19, 1998 [FR] France ................................ 98 10641

[51] Int. Cl.[7] .................................................. H03K 5/22
[52] U.S. Cl. ............................. 327/65; 327/432; 330/258
[58] Field of Search ................................ 327/65–67, 63, 327/77, 89, 432–433; 330/252, 253, 257, 258, 255, 311

[56] References Cited

U.S. PATENT DOCUMENTS

| | | | |
|---|---|---|---|
| 4,554,515 | 11/1985 | Burson et al. ........................... | 330/257 |
| 4,797,631 | 1/1989 | Hsu et al. ................................. | 330/253 |
| 5,293,136 | 3/1994 | Ryat . | |
| 5,455,535 | 10/1995 | Sauer ...................................... | 330/257 |
| 5,614,852 | 3/1997 | Giordano et al. .......................... | 327/65 |
| 5,734,297 | 3/1998 | Huijsing et al. .......................... | 330/258 |

FOREIGN PATENT DOCUMENTS

| | | |
|---|---|---|
| 0 512 795 A2 | 11/1992 | European Pat. Off. . |
| 0 827 272 A1 | 3/1998 | European Pat. Off. . |

Primary Examiner—Toan Tran
Attorney, Agent, or Firm—Theodore E. Galanthay; Michael J. Buchenhorner; Fleit, Kain, Gibbons, Gutman & Bongini P.L.

[57] ABSTRACT

A low supply voltage comparator in BICMOS technology includes: a first stage (1) with differential inputs (2,3) including, among others, two MOS transistors (MP1, MP2) of a first channel type controlling a first output bipolar transistor (T's); a second stage with differential inputs (2, 3) including, among others, two MOS transistors (MN1, MN2) (of a second channel type controlling a second output bipolar transistor (T's), the output transistors being mounted in series between two (A, M) terminals of application of respectively positive (Vdd) and negative (Vss) supply voltages; a switch (13' 13') for selecting one of the output transistors according to the common mode level of the input voltages with respect to the supply voltages; and a controller (15) for controlling the switch in all or nothing.

25 Claims, 5 Drawing Sheets

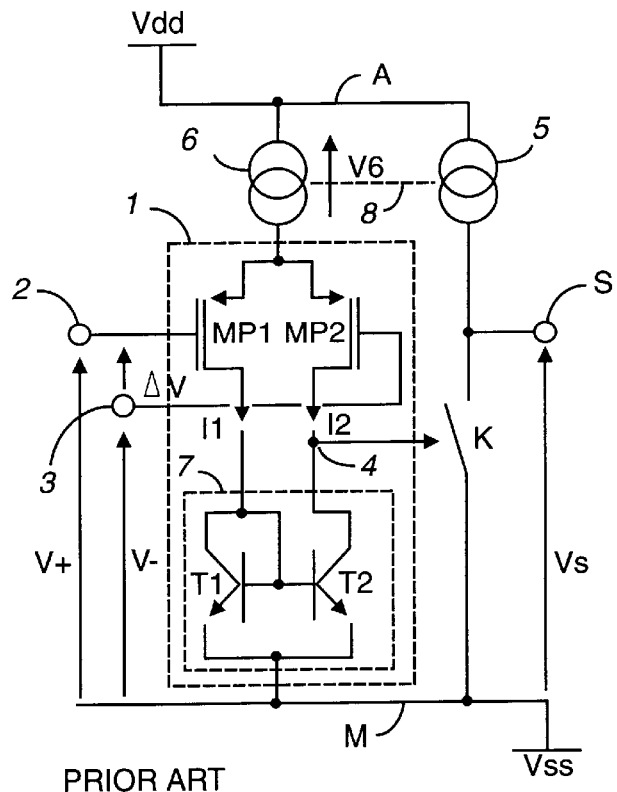
PRIOR ART FIG. 1
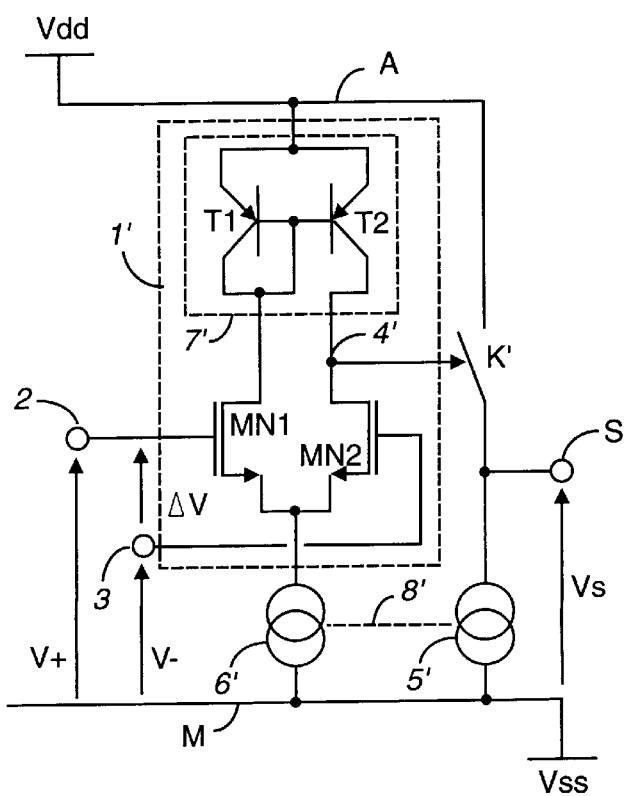
PRIOR ART FIG. 2

LOW SUPPLY VOLTAGE COMPARATOR IN BICMOS TECHNOLOGY

CROSS REFERENCE TO RELATED APPLICATIONS.

This application is based upon and claims priority from prior French Patent Application No. 98-10641, filed Aug. 19, 1998, the entire disclosure of which is herein incorporated by reference.

BACKGROUND OF THE INVENTION

1. Field of the Invention

The present invention relates to the field of comparators in BICMOS technology and, more specifically, to a comparator withstanding a small supply voltage (under 3 volts). The present invention more specifically relates to a comparator which withstands a large input voltage excursion, that is, the input voltages of which can have excursions close to the supply voltage, and which has a large output voltage excursion, that is, the output voltage of which switches between two voltages as close as possible to the supply voltages. This type of comparator is generally called an input and output rail-to-rail comparator.

2. Discussion of the Related Art

FIG. 1 shows a first conventional example of such a comparator. The comparator is formed of a differential stage 1, two positive and negative input terminals 2 and 3 which respectively receive voltages V+ and V− to be compared. Terminals 2 and 3 are purely arbitrarily said to be positive and negative, to define the direction of differential input voltage ΔV of the comparator. An output terminal 4 of stage 1 controls a switch K (for example, a bipolar transistor) mounted in series with a current source 5 between two terminals A and M on which are respectively applied high and low supply voltages Vdd and Vss.

In the example shown in FIG. 1, stage 1 is formed with two P-channel MOS transistors MP1, MP2, the gates of which are respectively connected to terminals 2 and 3 and the respective sources of which are connected, via a current source 6, to terminal A. The drains of transistors MP1 and MP2 are connected, via an active load 7, to terminal M. Active load 7 is, for example, formed of two NPN-type bipolar transistors T1, T2 mounted as a current mirror and respectively associated, each, with one of MOS transistors MP1, MP2. Transistor T1, associated with transistor MP1, is diode-mounted and the collector of transistor T2, associated with transistor MP2, defines output terminal 4 of differential stage 1. The respective collectors of transistors T1 and T2 are connected to the respective drains of transistors MP1 and MP2, while their emitters are connected to terminal M. Terminal 4 is connected to a control input of switch K (for example, the base of an NPN-type bipolar transistor). The midpoint of the series association of current source 5 and of switch K forms an output terminal S of the comparator.

When voltage V+ is smaller than voltage V−, voltage difference ΔV between terminals 2 and 3 is negative and current I1 through transistor MP1 is greater than current I2 through transistor MP2. Since transistor T2 attempts copying current I1, it saturates and prevents a control current from flowing to switch K which is thus open. Output voltage Vs of the comparator then corresponds to voltage Vdd-Vss, minus the voltage drop in current source 5. This voltage drop corresponds, for example if the current sources are made by means of bipolar transistors, to the collector-emitter voltage drop of a saturating bipolar transistor. If the current sources are formed of MOS transistors, this voltage drop corresponds to a drain-source voltage drop. Current sources 5 and 6 are generally formed of transistors mounted as a current mirror.

When V+=V−(Dv=0), currents I1 and I2 are balanced and switch K is open. Terminal S then is substantially at potential Vdd.

When voltage V+ is greater than voltage V−(DV>0), current I2 is greater than current I1. The current mirror between transistors T1 and T2 maintains the collector currents of transistors T1 and T2 identical. As a result, the current excess of transistor MP2 with respect to transistor MP1 flows towards the control terminal of switch K (the base of a bipolar transistor) which closes. Terminal S then is at voltage Vss plus the voltage drop in switch K in the closed state (the collector-emitter voltage drop of the saturating bipolar transistor). Thus, the output voltage excursion substantially corresponds to the supply voltage.

However, for such an assembly to operate, input voltages V+ and V− have to fulfil a common mode constraint, that is, a constraint on the mean voltage level between voltages V+ and V− (independently from differential voltage V). If the voltage of one of terminals 2, 3 is greater than potential Vdd, minus a threshold voltage Vth corresponding to the threshold (gate-source) voltage of transistor MP1 or MP2 plus voltage drop V6 in current source 6, the comparator no longer operates properly. If V−>Vdd−Vth, transistor MP2 is blocked and switch K cannot receive any current on its control terminal. Terminal S thus is substantially at potential Vdd, whatever voltage V+. If V+>Vdd−Vth, transistor MP1 is blocked and current I1 is null. Transistors T1 and T2 thus are both off (they receive no base current).

In practice, the comparator of FIG. 1 thus requires a common mode input voltage smaller by approximately 1 to 1.5 volts than the positive supply voltage. In other words, the voltages of terminals 2 and 3 have to be both smaller by approximately 1 to 1.5 volts than voltage Vdd for the comparator to operate properly.

A conventional assembly such as illustrated in FIG. 1 has the advantage of being able to operate under very small supply voltages (typically, on the order of 2 volts). However, it does not enable having input voltages which, in common mode, can extend over the entire supply voltage range.

FIG. 2 shows a second example of a conventional comparator which can operate under a small supply voltage. The assembly of FIG. 2 is similar to that of FIG. 1, but inverted with respect to terminals A and M and using N-channel MOS transistors instead of the P-channel MOS transistors of FIG. 1 and PNP-type bipolar transistors instead of the NPN-type bipolar transistors of FIG. 1. The elements of FIG. 2 which are identical to those in FIG. 1 have been referred to by the same references. Those having the same function, but which differ by their type (NPN instead of PNP) or channel (N instead of P) have been designated with the same references associated with an apostrophe (').

The assembly of FIG. 2 suffers from the same limitations as that in FIG. 1, but with respect to low supply voltage Vss. Indeed, the operation of differential input stage 1' is limited to input voltages which are, in common mode, greater than low supply voltage Vss, plus a threshold voltage Vth'. Threshold voltage Vth' here corresponds to the threshold (gate-source) voltage of an N-channel MOS transistor, plus voltage drop V6' in current source 6'.

In the voltage operating range of the comparator of FIG. 2, if $\Delta V^3 0$, switch K' (for example, a bipolar PNP-type transistor) is open and Vs>>Vss. If ΔV<0, switch K' is closed (the bipolar transistor forming it saturates) and Vs≈Vdd.

However, if V−<Vss+Vth', transistor MN2 is blocked whatever the value of voltage V+ and thus cannot draw current from the base of the transistor constitutive of switch K' which is thus open. Voltage Vs then is low, independently from potential difference ΔV. If V+<Vss+Vth', transistor MN1 is blocked independently from differential voltage DV. Transistors T'1 and T'2 are then blocked.

In practice, the comparator of FIG. 2 thus requires input voltages which are both greater by approximately 1 to 1.5 volts than the negative supply voltage, and thus a common mode voltage respecting this constraint.

It would be desirable to have a comparator withstanding a common mode voltage at least over the entire supply voltage range (Vdd−Vss) while maintaining a large output voltage excursion and a possibility of supply at very small voltage (on the order of 2 volts).

SUMMARY OF THE INVENTION

The present invention aims at providing a novel comparator structure that overcomes the shortcomings of the prior art.

The present invention also aims at providing such a comparator which has a low consumption and, in particular, the consumption of which is independent from the common mode voltage present on its inputs.

To achieve these objects, the present invention provides a low supply voltage comparator in BICMOS technology including a first stage with differential inputs including, among others, two MOS transistors of a first channel type controlling a first output bipolartransistor; a second stage with differential inputs including, among others, two MOS transistors of a second channel type controlling a second output bipolar transistor, the output transistors being mounted in series between two terminals of application of respectively positive and negative supply voltages; means for selecting one of the output transistors according to the common mode level of the input voltages with respect to the supply voltages; and means for controlling the selection means in all or nothing. Other possible embodiments are summarized herein without limiting the scope of the invention.

According to another embodiment of the present invention, the means for controlling the selection means comprises at least one inverter receiving as an input a voltage depending on the common mode voltage of the differential inputs.

According to another embodiment of the present invention, the control means includes two successive inverters of the measured voltage.

According to another embodiment of the present invention, the inverter(s) is (are) formed, each, of two transistors of opposite channel types and the respective gates of which are interconnected to form an input terminal of the inverter involved, the gates of the transistors of a first inverter forming an input terminal of the control means.

According to a further embodiment of the present invention, the comparator further includes a level shifting means for making the voltage received by the control means independent from possible technological dispersion.

According to another embodiment of the present invention, the level shifting means is formed of a MOS transistor of same channel type as the MOS transistors constitutive of the differential stage from which is sampled the voltage depending on the common mode voltage.

According to another embodiment of the present invention, the transistor constitutive of the level shifting means is sized to have a gate width-to-length ratio smaller than or equal to that of the transistor of same channel type forming the first inverter.

According to another embodiment of the present invention, the selection means are formed of two switches mounted in series between the supply terminals, the midpoint of the series association of the switches being connected to the output terminal and each switch being associated with a current source.

According to another embodiment of the present invention, each switch is formed of a MOS transistor of different type, the respective gates of these transistors receiving the output signal of the control means.

According to another embodiment of the present invention, the switches are controlled simultaneously and by a same output signal of the control means.

The foregoing objects, characteristics and advantages of the present invention will be discussed in detail in the following non-limiting description of specific embodiments, in connection with the accompanying drawings.

BRIEF DESCRIPTION OF THE DRAWINGS

FIGS. 1 and 2, previously described, are meant to show the state of the art and the problem to solve;

DETAILED DESCRIPTION

For clarity, the same elements have been referred to with the same references in the different drawings.

Figure 3:
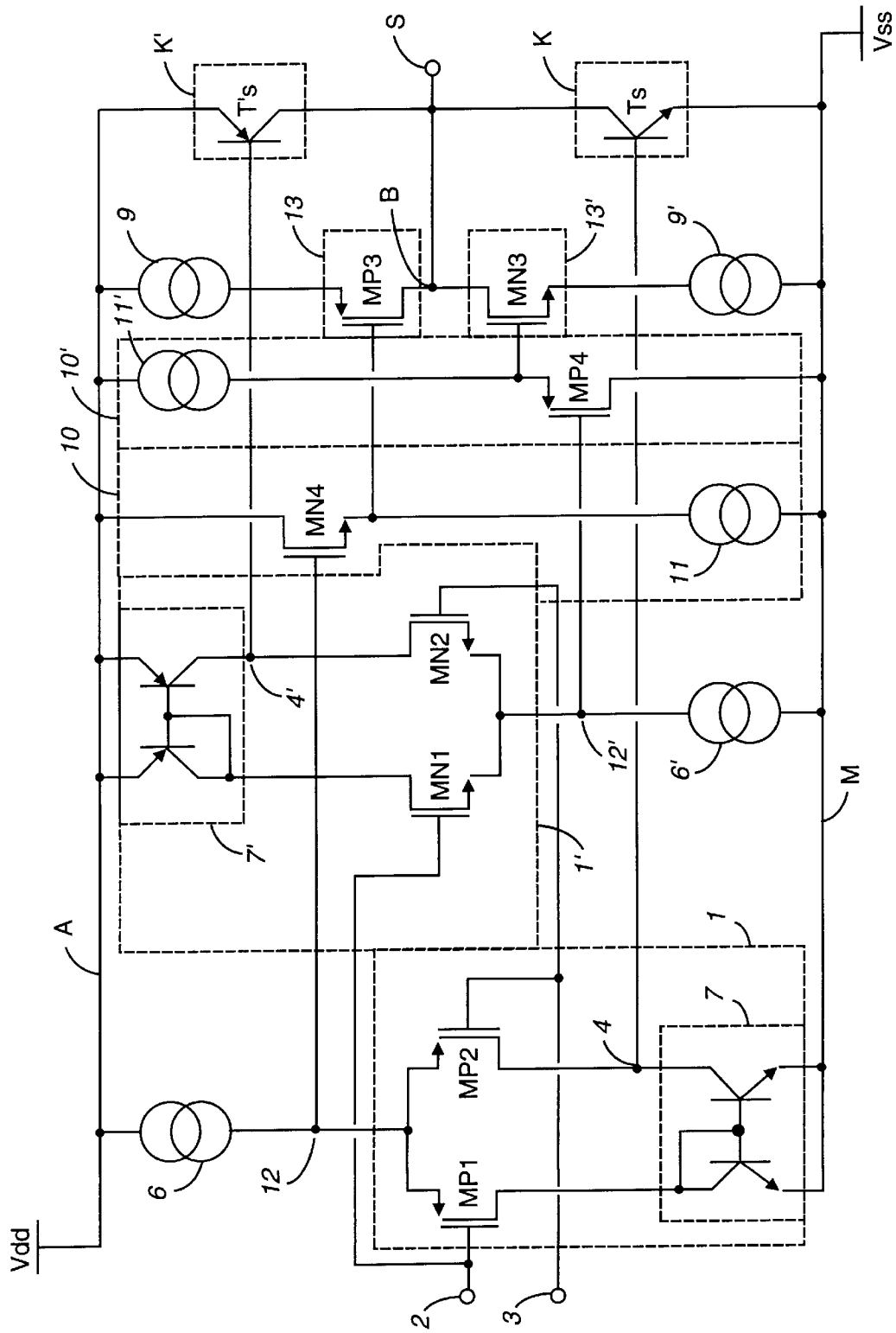
FIG. 3 schematically shows a first solution to make a comparator with a large input voltage excursion.

A first solution to make a comparator which operates with inputs withstanding a common mode voltage over the entire comparator supply voltage range while maintaining a large output voltage excursion is illustrated by FIG. 3.

The comparator of FIG. 3 comprises two input differential stages 1, 1', respectively associated with a current source 6, 6'. The first stage 1, similar to the differential stage shown in FIG. 1, is directly connected to a terminal M for application of a low supply voltage Vss and, via source 6, to a terminal A for application of a high supply voltage Vdd. The second differential stage 1', similar to the differential stage shown in FIG. 2, is directly connected to terminal A and, via source 6', to terminal M.

A positive input of each differential stage 1, 1' is connected to a terminal 2 of application of a first voltage V+, to be compared with a second voltage V− applied on a terminal 3 connected to a negative input of each stage 1, 1'. The respective outputs 4, and 4' of stages 1 and 1' are connected to the respective control inputs of two output switches K and K' (here, the respective bases of two bipolar output transistors Ts and T's) connected in series between terminals A and M. The emitter of PNP-type transistor T's is connected to terminal A. The emitter of NPN-type transistor Ts is connected to terminal M, and the collectors of transistors T's and Ts form an output terminal S of the comparator.

Midpoints 12, 12' of the series associations of current sources 6, 6' and of differential stages 1, 1' are respectively connected to a control terminal of a selector switch 13, 13'. Each switch 13,13' is associated with a current source 9, 9' mounted as a current mirror on source 6, 6' of the corresponding differential stage 1, 1'. Switches 13 and 13' further are connected in series and the midpoint B of their series association is connected to terminal S.

Thus, current source 9, switch 13, and transistor Ts, as well as transistor T's, switch 13', and source 9', are series connected between terminals A and M, the midpoint of the series association of transistor T's and switch 13' being connected to the midpoint of the series association of switch 13 and transistor Ts, and forming terminal S.

The function of switches 13 and 13' is to select a single one of current sources 9 or 9', respectively, when the common mode voltage (the mean voltage between voltages V+ and V−) is such that one of differential stages 1', 1 does not enable transistor T's or Ts, respectively, to properly operate.

Switches 13 and 13' are, for example, formed of MOS transistors, respectively a P-channel transistor MP3 and an N-channel transistor MN3, the respective drains of which are connected to terminal S. The sources of transistors MP3 and MN3 are respectively connected to terminals A and M via respective current sources 9 and 9'. The gates of transistors MP3 and MN3 are respectively connected to terminals 12 and 12', preferably, via a control stage 10, 10'. Control stages 10, 10' have the function of compensating the gate-source voltages of transistors MP1 and MP2, respectively MN1 and MN2, so that the gate potential of the involved transistor MP3 or MN3 approximately corresponds to the common mode voltage, that is, to the mean voltage of terminals 2 and 3.

Stage 10 is formed of an N-channel MOS transistor MN4, the drain of which is connected to terminal A and the source of which is connected, via a current source 11, to terminal M. The gate of transistor MN4 is connected to node 12 and its source is connected to the gate of transistor MP3. Stage 10' is formed of a P-channel MOS transistor MP4, the drain of which is connected to terminal M and the source of which is connected, via a current source 11', to terminal A. The gate of transistor MP4 is connected to node 12' and its source is connected to the gate of transistor MN3.

Current sources 9 and 11' are mounted as current mirrors on current source 6 of stage 1 and sources 9' and 11 are mounted as current mirrors on source 6' of stage 1'.

Figure 4A:
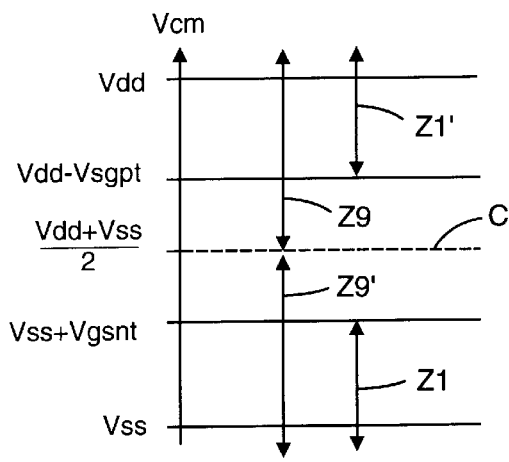
FIG. 4A illustrates the operation of the comparator of FIG. 3 according to the common mode voltage that it receives as an input and for typical characteristics of the transistors forming it.

The operation of a comparator such as shown in FIG. 3 is illustrated in FIG. 4A. This drawing shows the characteristic operating ranges of the comparator according to the common mode voltage Vcm ((V−+V+)/2) present on its inputs. Hereafter, Vgs or Vsg will designate the threshold voltage (gate-source or source-gate) of a MOS transistor and letter p or n will be used according to the channel, P or N, of this transistor, followed, in brackets, by the reference of the transistor involved if it can be identified. Letter t associated with some references means that the involved voltage corresponds to a typical (ideal) value as concerns technological dispersion, as will be further detailed hereafter. When letter t is omitted, it means that the involved relation is valuable in absolute (whatever the technological dispersion).

When the common mode input voltage is greater than value Vdd−Vsgp, stage 1 does not operate and the result of the comparison is determined by stage 1' (area Z1' in FIG. 4A). Indeed, when (V−+V+)/2<Vdd−Vsgp, transistors MP1 and MP2 are blocked and transistor Ts thus is blocked. Accordingly, transistor MN4 strongly conducts, and switch 13 thus is partially open (transistor MP3 lightly conductive). Further, node 12' is at a high voltage (−Vgsn+(V−+V+)/2). Accordingly, transistor MN2 conducts. Conversely, transistor MP4 lightly conducts and transistor MN3 strongly conducts, and switch 13' thus is partially closed. Since the operation of the comparator is determined by stage 1', if ΔV<0, transistor T's saturates and Vs>>Vdd. If DV>0, transistor T's is blocked and Vs>>Vss (through transistor MN3).

When the common mode input voltage is smaller than Vss+Vgsn, stage 1' does not operate, transistor T's being blocked, and the result of the comparison is determined by stage 1 (area Z1, FIG. 4A). In this condition, switch 13 is closed and switch 13' is open. Indeed, if (V−+V+)/2<Vss+Vgsn, transistors MN1 and MN2 are blocked and transistor T's thus is also blocked. Further, node 12 is at a low voltage (Vsgp+(V−+V+)/2). Accordingly, transistor MN4 lightly conducts and transistor MP3 strongly conducts. Switch 13 thus is partially closed. Further, transistor MP4 strongly conducts and, accordingly, transistor MN3 lightly conducts (switch 13' is partially open). In such conditions, if DV>0, transistor Ts saturates and Vs>>Vss. If DV<0, transistor Ts is blocked and Vs≈Vdd (through transistor MP3).

If the common mode input voltage is included between (or equal to) the two values Vss+Vgsn and Vdd−Vsgp, both stages 1 and 1' are supposed to operate and the state of output voltage Vs is determined by transistors Ts and T's. Sources 9 and 9' conduct one into the other. If DV>0, transistor Ts saturates and transistor T's is blocked. Accordingly, Vs≈Vss. If DV<0, transistor Ts is blocked, transistor T's saturates. Thus, Vs≈Vdd. Further, according to the common mode voltage level, one of sources 9 and 9' predominates upon the other (independently from the output switching). The respective predominance areas have been designated by Z9 and Z9' in FIG. 4A.

It should be noted that voltages V+ and V− can, in common mode, exceed supply voltages Vdd and Vss without adversely affecting the proper operation of the comparator. However, output voltage Vs will remain substantially equal to one of the two supply values Vdd or Vss.

A comparator such as illustrated in FIG. 3 has, with respect to the comparators illustrated in FIGS. 1 and 2, the advantage of operating whatever the input common mode level. Further, the comparator consumption is made independent from the common mode voltage. Indeed, current sources 9 and 9' enable making the current drawn from or provided to terminal S independent from voltages V+ and V−.

Further, by taking typical (ideal) values for the threshold voltages of the MOS transistors, the comparator of FIG. 3 achieves the object of operating under a low supply voltage on the order of 2 volts. Indeed, if no account is taken of technological dispersion, switching threshold c between sources 9 and 9' (illustrated by the dotted lines in FIG. 4A) can then be set to be at the center of range Vdd, Vss, and to have as a value (Vdd+Vss)/2. It should be noted that threshold c is not really a proper switching threshold but rather the value for which that of sources 9 or 9' which provides the greatest current changes.

For threshold c to correspond to (Vdd+Vss)/2, it is sufficient that MOS transistors MN4, MP3, MN3, MP4 be adequately sized, that is, that the P-channel transistors have gate width-to-length (W/L) ratios approximately three times as large as the N-channel transistors.

However, in practice, account has to be taken of the technological dispersion of the transistor characteristics in an industrial manufacturing. The minimum voltage of the comparator thus has to take account of the worst case of technological dispersion of the elementary components used.

In the present case, by using a BICMOS technology, it may be assumed that the sum of the absolute values of the respective threshold voltages of an N-channel transistor and of a P-channel transistor is constant. Further, the drain current of a transistor is, in absolute value, proportional to the absolute value of the gate-source voltage of this transistor minus its threshold voltage.

As a result, if a circuit transistor has to be run through by a predetermined current, the gate-source voltage of the transistor follows the variation of the threshold voltage due to technological dispersion. If the threshold voltage increases by a value DVth, the gate-source voltage also has to increase by the same value so that the drain current can be maintained constant independently from technological dispersion.

Taking typical (ideal) values such as those taken as an example in FIG. 4A, the following can be written:

Vgsnt(MN3)=Vcmt−Vgsnt(MN2)+Vsgpt(MP4), with Vcmt=(Vdd+Vss)/2 during the switching between current sources 9 and 9', and where t identifies typical gate-source (Vgs), source-gate (Vsg), or common mode (Vcm) values.

For the drain current of transistor MN3 to be constant for all industrially manufactured comparators, the worst case of technological dispersion has to be considered, that is, the case where the threshold voltage of the N-channel MOS transistors is equal to Vgsnt+DVth and where the threshold voltage of the P-channel MOS transistors is Vsgpt−DVth. As a result:

Vgsnt(MN3)+DVth=Vcmd−Vgsnt(MN2)−DVth+Vsgpt(MP4)−DVth.

The new switching value Vcmd between sources 9 and 9' thus is equal to typical value Vcmt plus 3DVth.

Figure 4B:
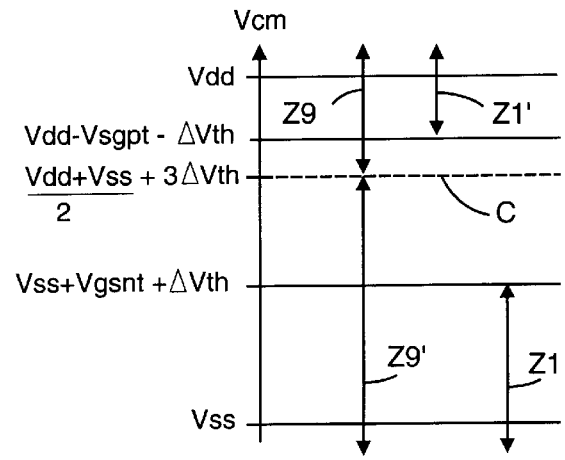
FIG. 4B illustrates the operation of the comparator of FIG. 3 according to the common mode voltage applied as an input and for characteristics of the transistors corresponding to a maximum technological dispersion with respect to the typical values.

This case of operation is illustrated by FIG. 4B where the different thresholds defining the comparator operating ranges have been shown, taking the worst case of technological dispersion.

The lower limit of range Z1 appears to increase by DVth, but the "switching" c between sources 9 and 9' increases by 3DVth.

The limiting value of the supplies enabling proper operation of the comparator can be deduced from the following relation:

(*Vdd+Vss*)/2=*Vdd−Vsgpt*(MP2), whereby Vdd−Vss=2*Vsgpt*(MP2).

As a result, for typical values and assuming that the voltage Vsgt of a P-channel MOS transistor is on the order of 1 volt, a minimum supply voltage Vdd−Vss on the order of 2 volts is obtained.

However, taking account of technological dispersion, the preceding relation becomes: (Vdd+Vss)/2+3DVth=Vdd−(Vsgpt(MP2)−DVth), whereby Vdd−Vss=2(Vsgpt(MP2)+2DVth).

Now, technological dispersion results in having a threshold voltage variation which can reach on the order of 200 mV in an HF2CMOS process taken as an example. As a result, the minimum supply voltage Vdd−Vss becomes 2.8 volts to enable an operation of the comparator taking account of manufacturing tolerances.

Figure 5:
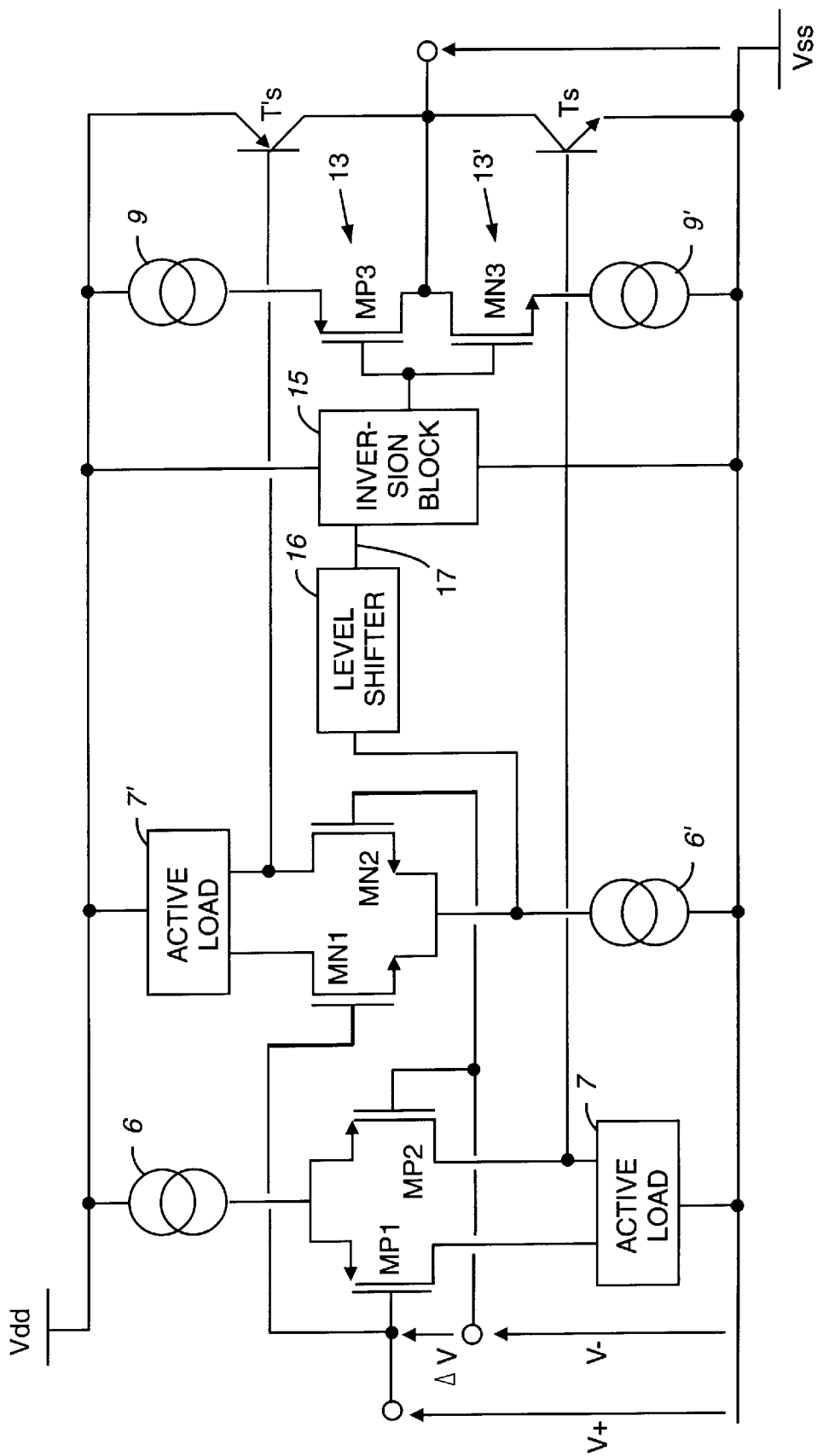
FIG. 5 schematically shows an embodiment of a comparator according to the present invention.

To decrease the minimum supply voltage while taking account of technological dispersion and respecting the characteristics of the input and output voltages of the comparator of FIG. 3, the present invention provides an improvement schematically illustrated in FIG. 5.

A characteristic of the present invention is to turn the gradual or analog switching between sources 9 and 9' of FIG. 3 into an instantaneous (digital) switching according to the common mode voltage applied as an input. It is thus desired, according to the present invention, to overcome the problem of the simultaneous conduction of transistors MP3 and MN3 constitutive of switches 13 and 13'.

Another characteristic of the present invention is to provide that the variation of the switching threshold between sources 9 and 9', due to the technological dispersions of the transistors used, follows the variations of the extremes of ranges Z1 and Z1'. In the representation of FIG. 5, not all details of the assembly have been shown, for clarity. In particular, the active loads of differential stages 1 and 1' have been schematically shown as blocks 7 and 7'.

The assembly of FIG. 5 is identical to that in FIG. 3, except for the control of selector switches 13 and 13' (transistors MP3 and MN3). Thus, it includes differential stages 1 and 1', current sources 6, 9, 6', and 9', and output transistors Ts and T's with connections identical to those shown in FIG. 3.

However, in the assembly of FIG. 5, transistors MP3 and MN3 are no longer individually controlled from respective stages 1 and 1', but are simultaneously controlled by a stage 15 based on a measurement of the input common mode voltage. Block 15 is formed of at least one inverter of a control signal sampled from the current source of one of the differential stages (here, source 6' of stage 1'). The level of this signal is preferably shifted to compensate the gate-source voltage of the transistor (here, MN2 or MN1) of the considered stage. This level shifter is symbolized in FIG. 5 by a block 16.

With such an assembly, sources 9 and 9' can no longer simultaneously conduct. Indeed, switches 13 (MP3) and 13' (MN3) which receive a same control signal directly coming from inversion block 15 cannot be simultaneously on or off. It can thus be assumed that switches 13 and 13' have been made digital.

Although it is possible to perform a signal inversion of the signal sampled from terminal 12, it will be preferred to perform a double inversion to simplify the controls as concerns the type of channel to be used for the different transistors. Thus, block 15 is preferably formed of two successive inverters, the output of the first inverter driving the input of the second inverter, the output of which controls the gates of transistors MP3 and MN3.

Any type of inverter may be used, for example, a conventional current source inverter. However, as will be seen hereafter in relation with FIG. 7, it is preferred to use CMOS inverters which have the advantage of generating a smaller consumption.

The function of level shifter 16 is to compensate a gate-source voltage corresponding to the input transistors of the differential stage on the current source of which is sampled the measurement signal for block 15, so that the signal inverted by block 15 corresponds as precisely as possible to the common mode input voltage.

Voltage V17 at input node 17 of the first inverter of block 15 thus is here equal to the mean voltage between the gates of transistors MN1 and MN2, and thus to the mean voltage between voltages V+ and V−.

Figure 6:
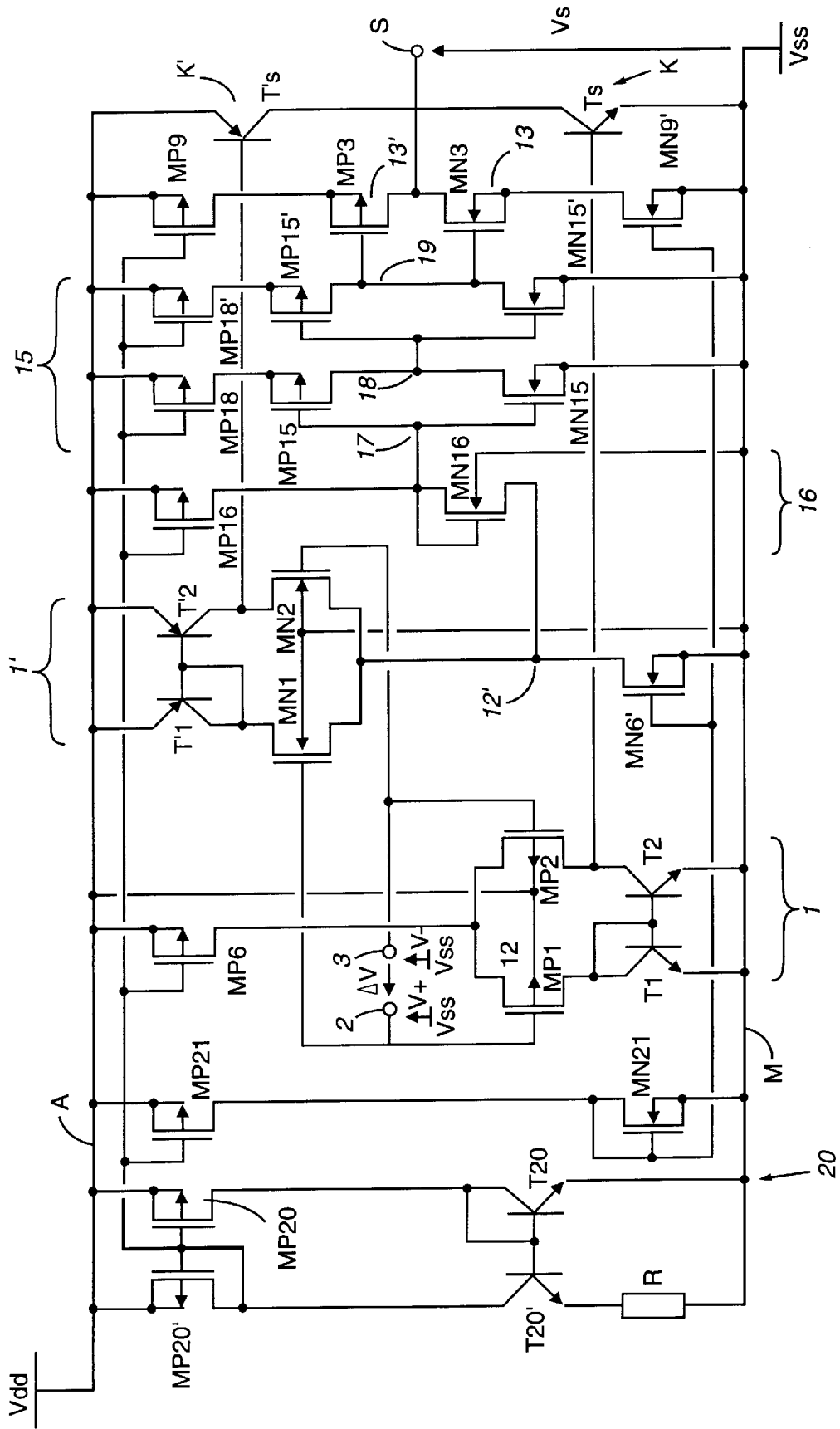
FIG. 6 is a detailed electric diagram of a comparator such as illustrated in FIG. 5.

FIG. 6 shows a detailed electric diagram of a preferred embodiment of a comparator according to the present invention. This diagram shows the elements of the comparator illustrated by FIG. 5.

In the embodiment of FIG. 6, the two inverters of block 15 have been made in the form of BICMOS inverters. Thus, a first inverter includes two MOS transistors, respectively a P-channel transistor MP15 and an N-channel MN15, in series. The gates of these transistors form input terminal 17 of the inverter, and the common drains of transistors MP15 and MN15 form an output terminal 18 of the first inverter towards the second inverter formed of two MOS transistors, respectively a P-channel transistor MP15' and an N-channel MN15', mounted in series. Terminal 18 corresponds to the gate of transistors MP15' and MN15'. Each inverter of block 15 includes a current source mounted as a current mirror on the other current sources of the assembly. A P-channel MOS transistor MP18 forms the current source of the first inverter, while a P-channel MOS transistor MP18' forms the current source of the second inverter In the assembly of FIG. 6, the different current sources of the comparator have been shown in the form of respective MOS transistors MP6, MP9, MN6', and MN9'. All these current sources are mounted as a current mirror on a control stage 20 described hereafter. The common drains of transistors MP15' and MN15' form an output terminal 19 of inversion block 15, connected to the gates of transistors MP3 and MN3.

In the example shown in FIG. 6, level shifter 16 is formed of a diode-mounted N-channel MOS transistor MN16 having its source connected to node 12'. Transistor MN16 is associated in series with a P-channel transistor MP16 forming a current source. The drain of transistor MN16 is connected to input terminal 17 of inversion block 15.

It should be noted that as an alternative, the inversion block could be driven by means of a level shifter formed of a P-channel MOS transistor, for example, stage 10' of FIG. 3. In this case, a level compensation is effectively performed between the voltages Vgs of transistors MN2 (or MN1) and MP4. However, an advantage of the embodiment illustrated in FIG. 6 is that it then is a compensation between two N-channel transistors which thus have strictly identical gate-source voltages, provided that transistors MN1, MN2, and MN16 have the same size. Control stage 20 of the current sources is, for example, formed of a so-called DVbe/R voltage source. The forming of such a DVbe/R voltage source is perfectly conventional. A first NPN-type bipolar transistor T20 is mounted as a diode and in series with a first P-channel MOS transistor MP20 between supply terminals A and M. This series association forms a first branch of the voltage source. A second branch is formed of a series association, between terminals A and M, of a diode-mounted P-channel MOS transistor MP20', of an NPN transistor T20', and of a resistor R. The gates of transistors MP20 and MP20' are interconnected and the gates of transistors T20 and T20' are interconnected. All transistors MP6, MP9, MP18, MP18', and MP16 constitutive of the high current sources of the assembly are mounted as a current mirror on transistor MP20, that is, their respective gates are connected to the gate of transistor MP20, their respective sources being connected to terminal A and their respective drains forming the output of each current source. The currents set by the different current sources conventionally depend on the size ratios between the mirror transistors and on the value of resistor R which determines the current to be copied.

To transfer the current to the level of the low sources (6' and 9') of the assembly, a P-channel MOS transistor MP21 mounted as a current mirror on transistor MP20 and, in series with this transistor MP21 between terminals A and M, a diode-mounted N-channel MOS transistor MN21, are for example used. Transistors MN6' and MN9' constitutive of current sources 6' and 9' then are mirror mounted on transistor MN21.

In FIG. 6, the different connections of the transistor bulks have been shown. All the assembly transistors have their respective bulks connected to their respective sources, except for transistor MN16 constitutive of level shifter 16 and transistors MP1, MP2, and MN1, MN2 constitutive of differential stages 1 and 1'. The bulks of transistors MP1 and MP2 are connected to terminal A, that is, to potential Vdd. The bulks of transistors MN1 and MN2 are connected to terminal M, that is, to potential Vss and the bulk of transistor MN16 is connected to terminal M. Such a connection of the transistor bulks increases the input common mode voltage operating range of the comparator.

Figure 7A:
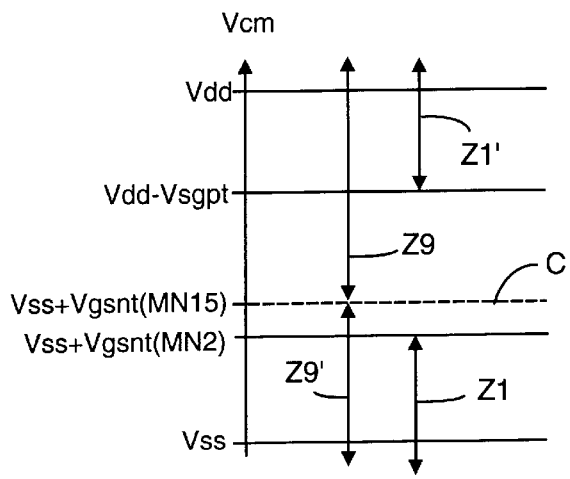
FIG. 7A illustrates the operation of the comparator of FIG. 6 according to the common mode voltage applied as an input and for typical characteristics of the transistors.
Figure 7B:
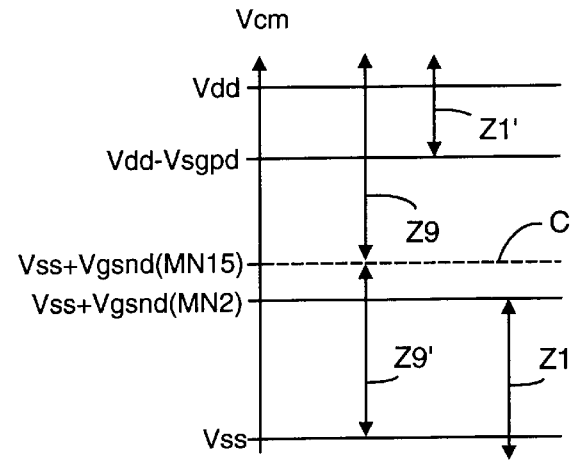
FIG. 7B illustrates the operation of the comparator of FIG. 6 according to the common mode voltage applied as an input and for characteristics of the transistors corresponding to a maximum technological dispersion with respect to the typical values.

The operation of the comparator according to the present invention is illustrated by FIGS. 7A and 7B which show, according to the input common mode voltage Vcm, the different operating ranges of a comparator according to whether the transistors forming it correspond to typical or ideal values (FIG. 7A) or correspond to values exhibiting a maximum drift with respect to the typical values (FIG. 7B).

As in FIGS. 4A and 4B, the drawings show areas Z1 and Z1' where the level of output voltage Vs is determined by a single one of differential stages 1 and 1' and an intermediary portion where this level is determined while both stages 1 and 1' operate.

The common mode voltage thresholds delimiting areas Z1 and Z1' are identical to those of the comparator of FIG. 3. However, switching threshold c between current sources 9 and 9' here is different. First, it should be noted that it is an abrupt threshold and not, as previously, a threshold corresponding to the time when one of the sources sees more current flowing than the other. Further, this threshold now is set by transistor MN15 of the first inverter of block 15 and corresponds to Vss+Vgsn (MN15). Accordingly, switching line c between sources 9 and 9' varies in the same direction as the threshold of range Z1. Further, as illustrated in FIG. 7B, the technological dispersions affect both thresholds in the same way, since they both depend on a single MOS transistor gate-source voltage (herein, an N-channel transistor). It is thus sufficient to adequately size transistors MN15, MN16, MN1, and MN2 so that the gate-source voltage of transistor MN15 is slightly greater than that of transistor MN1, MN2, and MN16, that is, to provide a smaller (or even equal) gate width-to-length ratio (W/L) for transistors MN16, MN1, and MN2 with respect to transistor MN15. In practice, it will be tried to make these values as close as possible to one another while being slightly different.

With such values, the minimum supply voltage (Vdd−Vss) of the comparator which approximately corresponds to Vsg(MP2)+Vgs(MN2) corresponds to approximately 2 volts, taking a typical voltage Vgs on the order of 1 volt for N- or P-channel MOS transistors.

An advantage of the circuits of FIGS. 5 and 6 thus is that they make the minimum supply voltage of the comparator independent from the technological dispersions of the MOS transistors forming it.

The present invention thus enables industrializing in a particularly optimal way an input and output rail to rail comparator such as illustrated in FIG. 3.

According to a preferred embodiment, the respective sizing of the different transistors (their gate width-to-length ratios) is optimized to obtain the smallest possible minimum voltage. In particular, it will be ascertained that transistor MN16 is of same size as transistors MN1 and MN2, the respective gate-sources of which it has to compensate.

Of course, the present invention is likely to have various alterations, modifications, and improvements which will readily occur to those skilled in the art. In particular, the respective sizing of the different MOS transistors will be within the abilities of those skilled in the art according to the application and the destination of the comparator and, in particular, the sizing of the different current sources will be adapted to the consumption desired for the assembly. Further, although reference has been made in the foregoing description to an assembly in which the measurement of the common mode voltage is performed from differential stage 1', it is perfectly possible to perform this common mode voltage measurement from differential stage 1. For this purpose, it is enough, in a preferred embodiment, to use a P-channel MOS transistor as a level shifter and to sample the input signal of the inverter, via this P-channel MOS transistor, from terminal 12. In this case, it will of course be ascertained to adapt the sizing of this transistor to the sizing of transistors MP1 and MP2.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A low supply voltage comparator in BICMOS technology comprising:

a set of differential inputs;

a first stage, coupled to the differential inputs, comprising two MOS transistors of a first channel type, the two MOS transistors comprising a first MOS transistor and a second MOS transistor coupled to the first MOS transistor, each of the differential inputs being coupled to one of the gates of the two MOS transistors;

a first output bipolar transistor controlled by the first stage;

a second stage, coupled to the differential inputs, comprising two MOS transistors of a second channel type, the two MOS transistors comprising a third MOS transistor and a fourth MOS transistor coupled to the third MOS transistor;

a second output bipolar transistor controlled by the second stage, the first and second output bipolar transistors being coupled to an output terminal and in series between two terminals for receiving respectively positive and negative supply voltages; and selection means for selecting one of the output bipolar transistors according to the common mode level of the input voltages with respect to the supply voltages.

2. The comparator of claim 1, further comprising control means for controlling the selection means.

3. The comparator of claim 2, wherein the means for controlling the selection means comprises at least one inverter for receiving as an input an input voltage depending on the common mode voltage of the differential inputs.

4. The comparator of claim 2, wherein the control means includes two successive inverters for receiving as an input an input voltage depending on the common mode voltage of the differential inputs.

5. The comparator of claim 3 wherein the inverter comprises two transistors of opposite channel types and the respective gates of which are interconnected to form an input terminal of the inverter involved, the gates of the transistors of a first inverter forming an input terminal of the control means.

6. The comparator of claim 4, wherein the inverters, each comprise two transistors of opposite channel types and the respective gates of which are interconnected to form an input terminal of the inverter involved, the gates of the transistors of the first inverter forming an input terminal of the control means.

7. The comparator of claim 3, further including level shifting means for making the voltage received by the control means independent from possible technological dispersion.

8. The comparator of claim 7, wherein the level shifting means is formed of a MOS transistor of same channel type as the MOS transistors constitutive of the second differential stage, from which is sampled the voltage depending on the common mode voltage.

9. The comparator of claim 8, wherein the transistor constitutive of the level shifting means is sized to have a gate width-to-length ratio smaller than or equal to that of the transistor of same channel type forming the first inverter.

10. The comparator of any of claim 2, wherein the selection means are formed of two switches mounted in series between the supply terminals, the midpoint of the series association of the switches being connected to the output terminal and each switch being associated with a current source.

11. The comparator of claim 10, wherein each switch is formed of a MOS transistor of different type, the respective gates of these transistors receiving the output signal of the control means.

12. The comparator of claim 10, wherein the switches are controlled simultaneously and by a same output signal of the control means.

13. A low supply voltage comparator in BICMOS technology comprising:

a set of differential inputs;

a first stage, coupled to the differential inputs, comprising two MOS transistors of a first channel type, the two MOS transistors comprising a first MOS transistor and a second MOS transistor coupled to the first MOS transistor, each of the differential inputs being coupled to one of the gates of the two MOS transistors;

a first output bipolar transistor controlled by the first stage;

a second stage, coupled to the differential inputs, comprising two MOS transistors of a second channel type, the two MOS transistors comprising a third MOS transistor and a fourth MOS transistor, coupled to the third MOS transistor;

a second output bipolar transistor controlled by the second stage, the first and second output bipolar transistors being coupled to an output terminal and in series between two terminals for receiving respectively positive and negative supply voltages; and a switch for selecting one of the output bipolar transistors according to the common mode level of the input voltages with respect to the supply voltages.

14. The comparator of claim 13, further comprising a controller for controlling the selection means.

15. The comparator of claim 14, wherein the controller comprises at least one inverter for receiving as an input an input voltage depending on the common mode voltage of the differential inputs.

16. The comparator of claim 14, wherein the controller includes two successive inverters of the measured input voltage.

17. The comparator of claim 15, wherein the inverter comprises two transistors of opposite channel types and the respective gates of which are interconnected to form an input terminal of the inverter involved, the gates of the transistors of a first inverter forming an input terminal of the control means.

18. The comparator of claim 16, wherein the inverters, each comprise two transistors of opposite channel types and the respective gates of which are interconnected to form an input terminal of the inverter involved, the gates of the transistors of the first inverter forming an input terminal of the control means.

19. The comparator of claim 16, further including a level shifter for making the voltage received by the control means independent from possible technological dispersion.

20. The comparator of claim 19, wherein the level shifter is formed of a MOS transistor of same channel type as the MOS transistors constitutive of the second differential stage, from which is sampled the voltage depending on the common mode voltage.

21. The comparator of claim 20, wherein the transistor constitutive of the level shifter is sized to have a gate width-to-length ratio smaller than or equal to that of the transistor of same channel type forming the first inverter.

22. The comparator of claim 14, wherein the switch is formed of two switches mounted in series between the supply terminals, the midpoint of the series association of the switches being connected to the output terminal and each switch being associated with a current source.

23. The comparator of claim 22, wherein each switch is formed of a MOS transistor of different type, the respective gates of these transistors receiving the output signal of the control means.

24. The comparator of claim 24, wherein the switches are controlled simultaneously and by a same output signal of the control means.

25. An information handling system comprising a low supply voltage comparator in BICMOS technology comprising:

a set of differential inputs;

a first stage, coupled to the differential inputs, comprising two MOS transistors of a first channel type, the two MOS transistors comprising a first MOS transistor and a second MOS transistor coupled to the first MOS transistor, each of the differential inputs being coupled to one of the gates of the two MOS transistors;

a first output bipolar transistor controlled by the first stage;

a second stage, coupled to the differential inputs, comprising two MOS transistors of a second channel type, the two MOS transistors comprising a third MOS transistor and a fourth MOS transistor coupled to the third MOS transistor;

a second output bipolar transistor controlled by the second stage, the first and second output bipolar transistors being coupled in an output terminal and in series between two terminals for receiving respectively positive and negative supply voltages;

a switch for selecting one of the output bipolar transistors according to the common mode level of the input voltages with respect to the supply voltages; and a controller for controlling the selection means.

* * * * *